(12) United States Patent
Meotto et al.

(10) Patent No.: US 8,329,545 B1
(45) Date of Patent: Dec. 11, 2012

(54) METHOD OF FABRICATING A CHARGE TRAP NAND FLASH MEMORY

(75) Inventors: Umberto M. Meotto, Rivoli (IT); Giulio Albini, Milan (IT); Paolo Tessariol, Montebelluna (IT); Paola Bacciaglia, Bellusco (IT); Marcello Mariani, Milan (IT)

(73) Assignee: Micron Technology, Inc., Boise, ID (US)

( * ) Notice: Subject to any disclaimer, the term of this patent is extended or adjusted under 35 U.S.C. 154(b) by 472 days.

(21) Appl. No.: 12/346,363

(22) Filed: Dec. 30, 2008

(51) Int. Cl.
*H01L 21/336* (2006.01)

(52) U.S. Cl. .......... 438/296; 257/E21.54; 257/E21.645; 257/E21.66

(58) Field of Classification Search .................. 438/286, 438/424, 425; 257/E21.54, E21.645, E21.66
See application file for complete search history.

(56) References Cited

U.S. PATENT DOCUMENTS

| | | | |
|---|---|---|---|
| 7,723,777 B2* | 5/2010 | Power et al. | 257/316 |
| 7,955,960 B2* | 6/2011 | Kim et al. | 438/496 |
| 2003/0042534 A1* | 3/2003 | Bhattacharyya | 257/317 |
| 2005/0250307 A1* | 11/2005 | Park et al. | 438/618 |
| 2006/0118854 A1* | 6/2006 | Lee | 257/315 |
| 2008/0157092 A1* | 7/2008 | Arai et al. | 257/67 |
| 2010/0038696 A1* | 2/2010 | Power et al. | 257/316 |

* cited by examiner

*Primary Examiner* — Jarrett Stark
(74) *Attorney, Agent, or Firm* — Knobbe, Martens, Olson & Bear LLP

(57) ABSTRACT

Subject matter disclosed herein relates to a method of manufacturing a semiconductor integrated circuit device, and more particularly to a method of fabricating a charge trap NAND flash memory device.

19 Claims, 6 Drawing Sheets

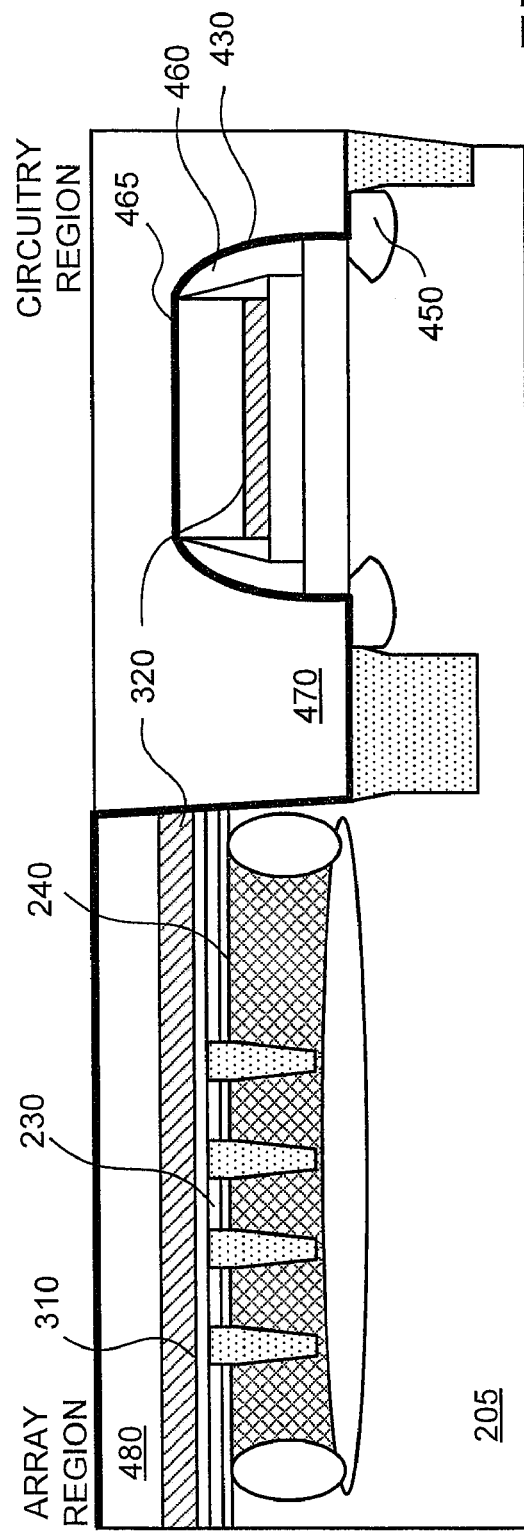

METHOD OF FABRICATING A CHARGE TRAP NAND FLASH MEMORY

BACKGROUND

1. Field

Subject matter disclosed herein relates to a method of manufacturing a semiconductor integrated circuit device, and more particularly to a method of fabricating a charge trap NAND flash memory device.

2. Information

Floating gate cells are typically integrated with high voltage (HV) and low voltage (LV) transistors in semiconductor devices such as NAND flash memories. A single thin oxidation is typically used to build both LV metal oxide semiconductor substrate (MOS) and LV cell structure. In such a case, an LV oxide and a tunnel oxide may grow on the substrate during the same process step. Such a single process step and a resulting structure, however, may limit scalability and reliability of the resulting structure.

BRIEF DESCRIPTION OF THE FIGURES

Non-limiting and non-exhaustive embodiments will be described with reference to the following figures, wherein like reference numerals refer to like parts throughout the various figures unless otherwise specified.

FIG. 4A is a cross-sectional view of a semiconductor structure along a wordline of an array region, according to an embodiment.

DETAILED DESCRIPTION

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a charge trap NAND flash memory structure may include a metal gate layer that is common to both an array region and a circuitry, or peripheral region. Such a common metal gate layer may be used both for array connections, such as for word and/or bit lines for example, and peripheral circuitry connections. In a particular embodiment, a charge trapping layer may be disposed on a tunnel oxide layer. Such a charge trapping layer may act as a charge storage element during an operation of the NAND semiconductor device, for example. In another particular embodiment, which will be described in detail below, a double pre-metal dielectric process may be applied to an array region and a circuitry region, wherein each such region may include substantially different materials. Accordingly, an array region and a circuitry region may each involve different lithography processes, such as an etching process. In one implementation, an array region may be masked while such lithography processes are applied to a neighboring circuitry region. Thereafter, the circuitry region may be masked while lithography processes are applied to the array region, for example.

Figure 1:
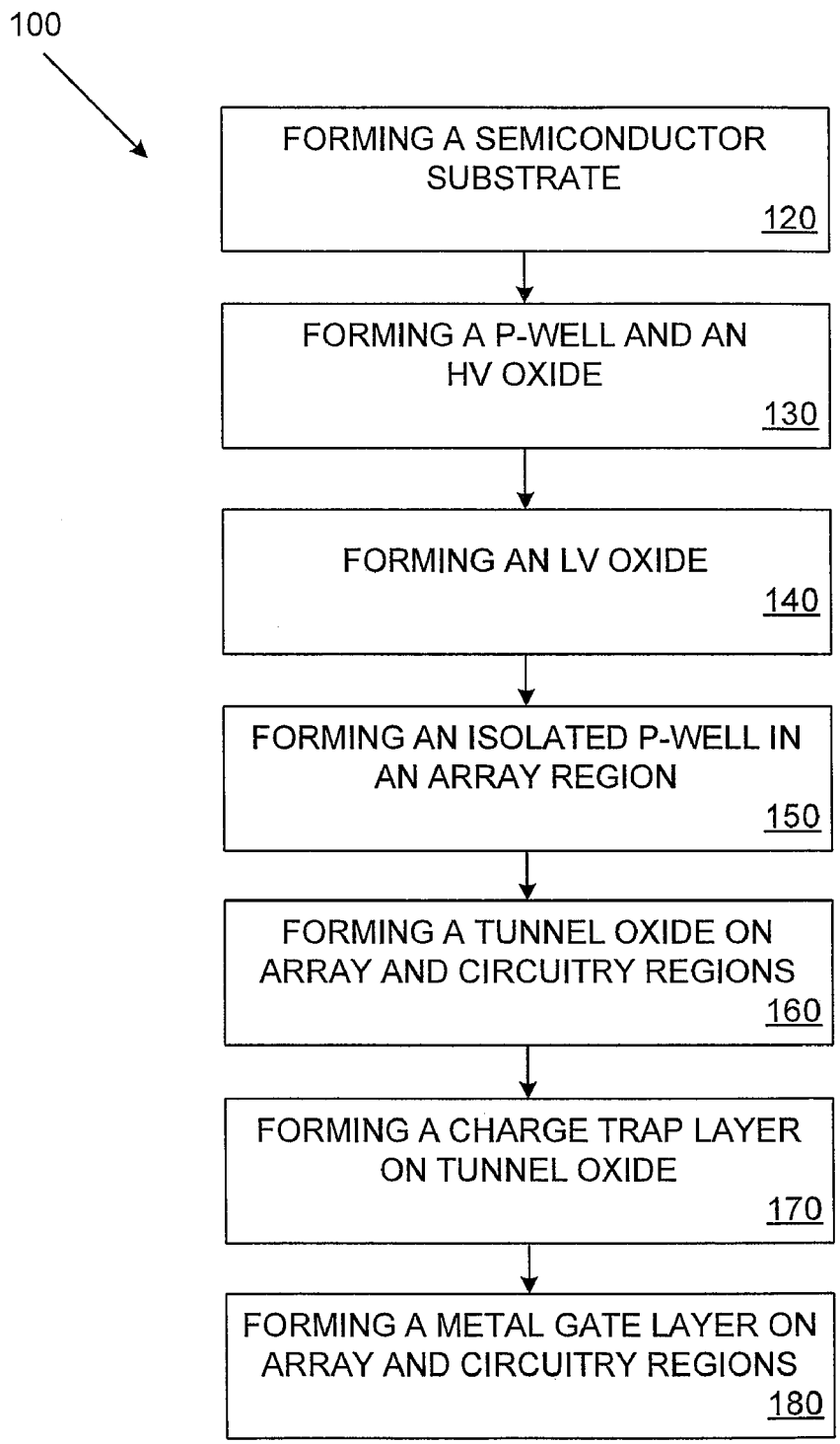
FIG. 1 is a flow diagram of a process to fabricate a charge trap NAND flash memory device, according to an embodiment.
Figure 2:
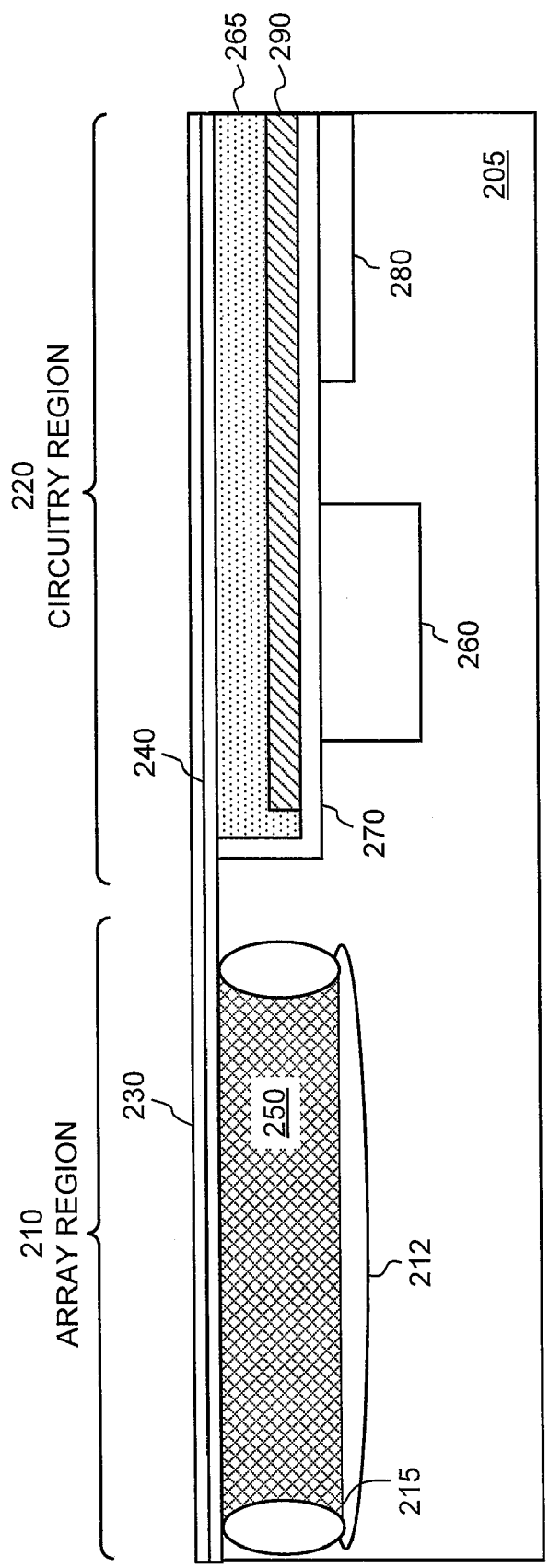
FIG. 2 is a cross-sectional view of a semiconductor structure including an array region and a circuitry region, according to an embodiment.

FIG. 1 is a flow diagram of a process 100 to fabricate a charge trap NAND flash memory device, according to an embodiment. FIG. 2 is a cross-sectional view of a semiconductor structure including an array region and a circuitry region, also according to an embodiment. At block 120, a semiconductor substrate is formed. Referring to FIG. 2, in a particular embodiment such a substrate may comprise substrate 205 including an array region 210 and a periphery circuitry region 220. Substrate 205 may include a recession so that circuitry region 220 can be formed lower than array region 210. Such a difference in height between array region 210 and circuitry region 220 may be useful to avoid problems associated with using a chemical mechanical polishing (CMP) process, for example. Such problems may include planarization by-products such as residual materials resulting from CMP process steps. Referring again to FIG. 1, at block 130, a p-well 260 may be formed in circuitry region 220 of semiconductor substrate 205. At block 140, a low voltage (LV) oxide 270 and high voltage (HV) oxide 280 may be formed from an oxide layer in circuitry region 220. In a particular embodiment, LV oxide 270 may be formed by growing an oxide layer, whereas HV oxide 280 may be formed by selective oxidation, for example. Also, LV oxide 270 may be formed on p-well 260, whereas HV oxide 280 may be formed adjacent to p-well 260. A polysilicon layer 290 may be deposited on both array region 210 and circuitry region 220 to cover LV oxide 270 and HV oxide 280. In another particular embodiment, LV oxide may be formed where LV circuitry is needed, such as on an n-well or a p-well, for example, whereas HV oxide maybe be formed in all HV regions, such as on an n-well or a p-well)." A high temperature oxide (HTO) and/or PECVD oxide 265 may be formed over polysilicon layer 290. Referring to FIG. 1, at block 150, an isolated p-well 250 may be formed above a buried n-well implant 212. n-well implant walls 215 may also be formed adjacent to p-well 250. Polysilicon may be removed from array region 210 while remaining in circuitry region 220. Exposed LV oxide 270 in array region 210 may be cleaned using a wet etch (e.g., HF and/or a diluted buffered oxide etch (BOE)) until array region 210 and circuitry region 220 become substantially level. At block 160, a tunnel oxide 240 may be grown on array region 210 and on circuitry region 220, covering isolated p-well 250 and recessed circuitry. Next, at block 170, a charge trap layer 230 may be deposited on tunnel oxide 240.

Figure 3:
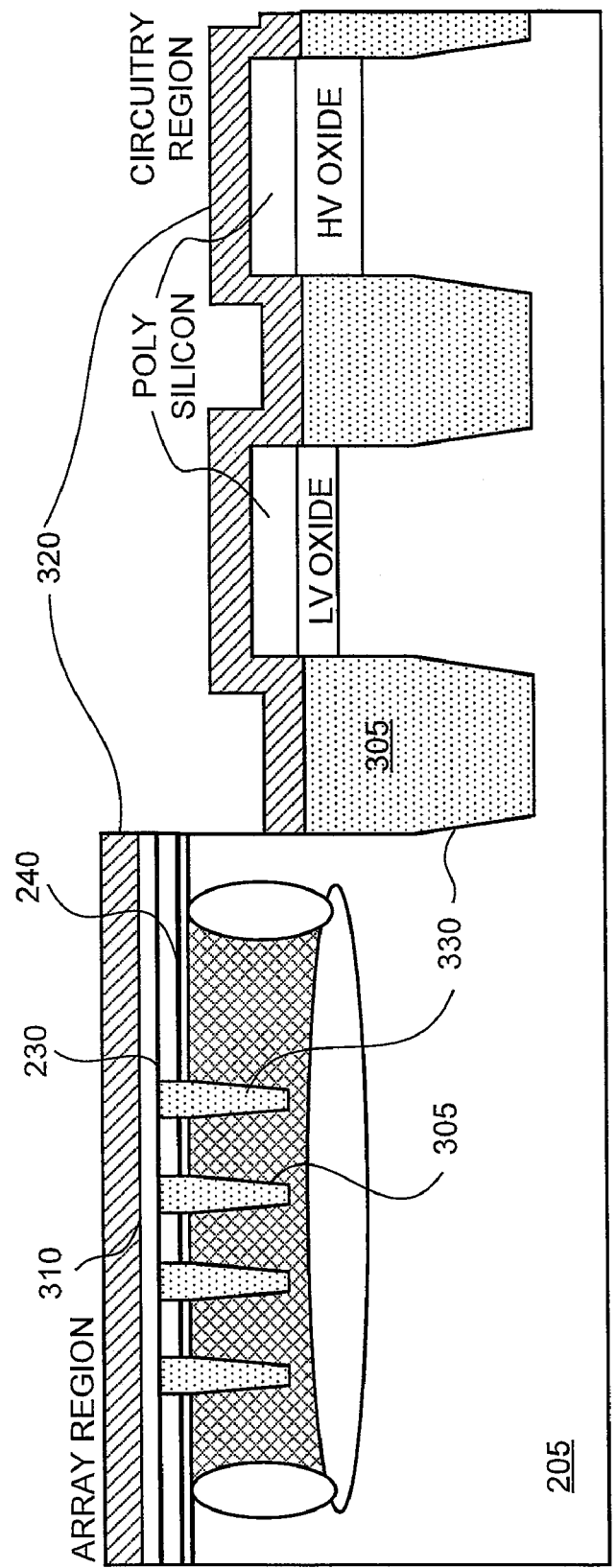
FIG. 3 is a cross-sectional view of a semiconductor structure including a charge trap layer and a metal gate, according to an embodiment.

FIG. 3 is a cross-sectional view of a semiconductor structure including a charge trap layer and a metal gate, such as those elements shown in the embodiment of FIG. 2. An insulating material 305 may be used to fill trenches 330 formed in array region 210 and circuitry region 220. Such an insulating material may include silicon dioxide, for example. Next, excess insulating material 305 may be planarized to form shallow trench isolation (STI) structures. In a particular embodiment, further processes may include a sidewall oxidation, filling, and CMP, for example. In a particular implementation, a filling process may include a high density plasma (HDP) deposition and/or a spin-on dielectric (SOD) process. A wet etch, or desox, process may be performed to remove any excess oxide material in order to form a desirable profile for a high-k layer deposition on charge trap layer 230 in both array region 210 and circuitry region 220. In a particular implementation, such a high-k layer deposition may be removed from circuitry region 220, leaving a high-k layer 310.

Referring to FIGS. 1 and 3, at block 180, a metal gate layer 320 may be deposited on high-k layer 310 in array region 210 and on polysilicon layer 290 in circuitry region 220. In a particular embodiment, metal gate layer 320 may be common for both array region 210 and circuitry region 220. In other words, the same metal layer may be used to metalize both the array region and the peripheral transistors (FIG. 4A) in the circuitry region, for example. Accordingly, in a particular example, the metal layer used to metalize the array region and the metal layer to metalize the peripheral transistors in the circuitry region may both comprise the same material composition. Such a common metal gate layer may be used for a local interconnection between array region 210 and circuitry region 220, for example. In a particular embodiment, metal gate layer 320 may be used as an electrical connection between word lines and array/circuitry region 210/220. In another particular embodiment, metal gate layer 320 may be used as an electrical connection between a source connection and array/circuitry region 210/220. Of course, such electrical connections are merely examples, and claimed subject matter is not so limited.

In an embodiment, the semiconductor structure shown in FIG. 3 may be further treated using a NAND-one-gate-mask process flow, wherein both array region 210 and circuitry region 220 are treated at the same time by single mask processes. In another embodiment, the semiconductor structure shown in FIG. 3 may be further treated in a process flow performed for one region before the other region. For example, a process flow may be performed for array region 210 after performing a separate process flow for circuitry region 220. Such a process flow may include lithographic processes, such as masking and etching processes, for example.

Figure 4B:
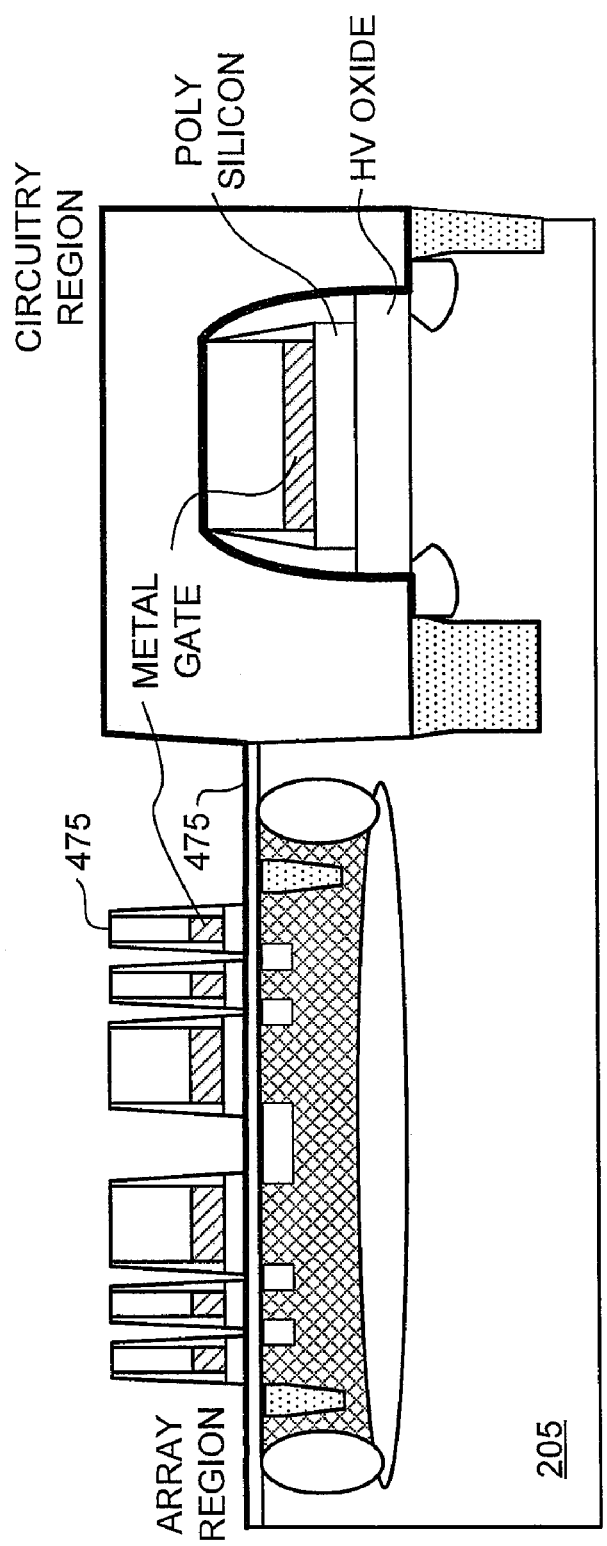
FIG. 4B is a cross-sectional view of a semiconductor structure along a bitline of an array region, according to an embodiment.

A flow process wherein a circuitry region is developed before an array region will now be described with reference to FIGS. 4A and 4B. FIG. 4A is a cross-sectional view of a semiconductor structure along a wordline of an array region and FIG. 4B is a cross-sectional view of a semiconductor structure along a bitline of an array region, according to an embodiment. An oxide hard mask (not shown) may be formed on an array region, such as array region 210 shown in FIG. 2 for example, to protect the array region during subsequent processing of a circuitry region, such as circuitry region 220 shown in FIG. 2. Such a hard mask may also be formed on a metal gate layer in circuitry region 220, though portions, such a local interconnections may be exposed and/or covered only by an etching mask. In this fashion, array region 210 may be protected while local interconnections and portions of the circuitry region, including periphery gates for example, may be patterned. Lightly doped drain (LDD) junctions 450 may be formed for both LV transistors (not shown) and HV transistors 430 in circuitry region 220 by masked ion implantation. In a particular embodiment, spacers 460 in conjunction with selective masking may be used to form such LDD junctions. Using a similar masking process, n+ and p+ junctions may be formed in circuitry region 220. Meanwhile, the hard mask protecting array region 210 may be formed thick enough to avoid ion contamination in the array region while performing ion implantation in circuitry region 220.

In a subsequent process, a conformal borderless nitride 465 may be formed. Next, a dielectric layer 470, such as silicon oxide and/or a low-k material, may be formed. Next, a CMP process may be performed on layer 470 until layer 470 is level with exposed portions of nitride 465. That is, layer 470 may be completely removed from the array region.

In an embodiment, patterning of array gates and cell definition may now be performed in array region 210. In a particular embodiment, an array gate etch may be performed in array region 210, allowing LDD and source/drain implantations without altering circuitry region 220.

Figure 5:
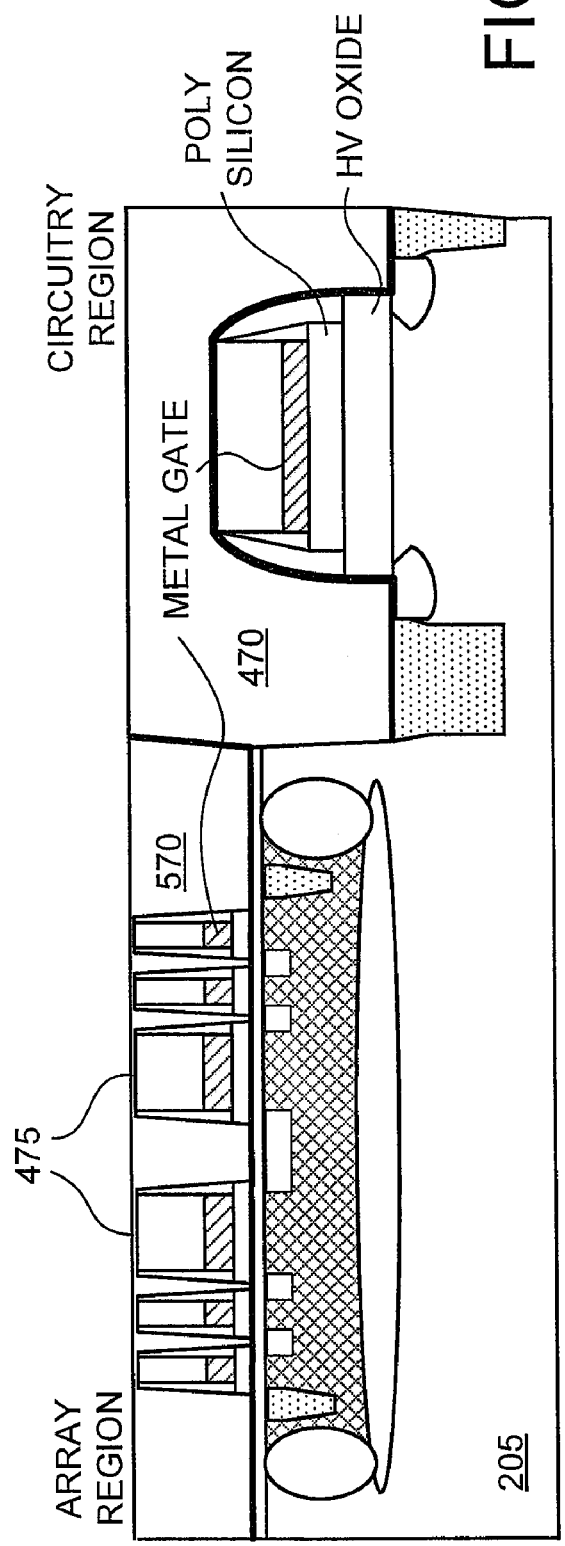
FIG. 5 is a cross-sectional view of a semiconductor structure including pre-metal deposition, according to an embodiment.

FIG. 5 is a cross-sectional view of a semiconductor structure showing a dielectric layer 570, such as silicon oxide and/or a low-k material, formed adjacent to cells in array region 210, according to an embodiment. A CMP process may be performed on layer 570 until layer 570 is substantially level with exposed portions of nitride 475. In a particular embodiment, a process subsequent to process 100 shown in FIG. 1 may conclude by forming various contacts, including a dual damascene back end process.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method of fabricating a charge trap NAND memory device, the method comprising:
   forming a recessed silicon region in a circuitry region of a semiconductor substrate, wherein a height of said recessed silicon region is less than a height of an array region of said semiconductor substrate;
   after forming said recessed silicon region in said circuitry region:
      forming trenches in said recessed silicon region; and
      filling said trenches with an insulating material, and planarizing a resultant structure to form shallow trench isolation (STI) structures to define one or more wells, low voltage (LV) gate oxides, and high voltage (HV) gate oxides in said recessed silicon region;
   forming an isolated p-well in an array region of said semiconductor substrate; and
   forming a tunnel oxide on said array region.

2. The method of claim 1, further comprising:
   forming a charge trap layer on said tunnel oxide.

3. The method of claim 2, further comprising:
   forming a high-k layer on said charge trap layer;
   forming a polysilicon layer over said LV gate oxide and said HV gate oxide; and
   forming a metal gate layer on said high-k layer in said array region and on said polysilicon layer in said circuitry region.

4. The method of claim 3, further comprising:
   forming an oxide hard mask layer on said metal gate layer; and
   patterning said metal gate layer using said hard mask layer to form periphery gates and a local interconnection between said array region and said circuitry region.

5. The method of claim 4, wherein forming said oxide hard mask layer on said metal gate layer in said array region and forming said oxide hard mask layer on said metal gate layer in said circuitry region are performed at different times.

6. The method of claim 5, further comprising selectively etching said oxide hard mask layer, wherein selectively etching said oxide hard mask layer in said array region and selectively etching said oxide hard mask layer in said circuitry region are performed at different times.

7. The method of claim 3, further comprising:
forming a first oxide hard mask layer on said metal gate layer in said array region; and
forming a second oxide hard mask layer on said metal gate layer in said circuitry region, wherein forming said first oxide hard mask layer and forming said second oxide hard mask layer are performed at different times.

8. The method of claim 6, further comprising:
selectively etching said first oxide hard mask layer in said array region; and
selectively etching said second oxide hard mask layer in said circuitry region, wherein selectively etching said first oxide hard mask layer and selectively etching said second oxide hard mask layer are performed at different times.

9. The method of claim 8, further comprising:
forming a first pre-metal dielectric in said array region; and
forming a second pre-metal dielectric in said circuitry region, wherein forming said first pre-metal dielectric and forming said second pre-metal dielectric are performed at different times.

10. The method of claim 1, further comprising:
forming a metal gate layer in said array region and in said recessed silicon region, wherein said metal gate layer is common for both said array region and said recessed silicon region;
masking a portion of said metal gate layer in said recessed silicon region to form a patterned metal gate layer; and
electrically interconnecting said array region with said recessed silicon region using said metal gate layer.

11. A method of manufacturing a semiconductor integrated circuit memory structure, the method comprising:
forming a recessed silicon region in a peripheral region of a semiconductor substrate, wherein a height of said recessed silicon region is less than a height of an array region of said semiconductor substrate;
after forming said recessed silicon region in said circuitry region:
forming a metal gate layer common to said array region and said recessed silicon region of said memory structure; and
masking a portion of said metal gate layer in said recessed silicon region to form a patterned metal layer; and
electrically interconnecting said array region with said recessed silicon region using said metal gate layer, wherein said array region is formed by a lithography process different than that of said recessed silicon region.

12. The method of claim 11, wherein said memory structure comprises a charge trap NAND flash memory structure.

13. The method of claim 11, wherein said array region comprises word and/or bit lines.

14. The method of claim 11, further comprising:
forming a first pre-metal dielectric in said array region; and
forming a second pre-metal dielectric in said peripheral region, wherein forming said first pre-metal dielectric and forming said second pre-metal dielectric are performed at different times.

15. The method of claim 14, wherein said array region and said peripheral region comprise materials that are substantially different from one another.

16. The method of claim 11, further comprising:
forming one or more wells and/or active gate oxides in said peripheral region, wherein said one or more wells and/or active gate oxides include an LV oxide and/or an HV oxide.

17. The method of claim 11, further comprising:
forming a first metal gate layer in said array region; and
forming a second metal gate layer in said peripheral region, wherein said first metal gate layer and second metal gate layer comprise substantially the same material composition.

18. The method of claim 17, wherein said first metal gate layer comprises a source connection to said array region.

19. The method of claim 17, wherein said first metal gate layer comprises a connection between word lines and said array region.

* * * * *

UNITED STATES PATENT AND TRADEMARK OFFICE
CERTIFICATE OF CORRECTION

| | | |
|---|---|---|
| PATENT NO. | : 8,329,545 B1 | Page 1 of 1 |
| APPLICATION NO. | : 12/346363 | |
| DATED | : December 11, 2012 | |
| INVENTOR(S) | : Umberto M. Meotto et al. | |

It is certified that error appears in the above-identified patent and that said Letters Patent is hereby corrected as shown below:

On the Title page, in Item (54), column 1, and in column 1, line 2, under "Title", line 2, after "MEMORY" insert -- DEVICE --.

Signed and Sealed this
Nineteenth Day of March, 2013

Teresa Stanek Rea
*Acting Director of the United States Patent and Trademark Office*